United States Patent
West et al.

(10) Patent No.: US 7,309,651 B2
(45) Date of Patent: Dec. 18, 2007

(54) METHOD FOR IMPROVING RELIABILITY OF COPPER INTERCONNECTS

(75) Inventors: Jeffrey A. West, Dallas, TX (US); Michael D. Barth, Plano, TX (US); Steven P. Zuhoski, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/697,137

(22) Filed: Oct. 30, 2003

(65) Prior Publication Data

US 2005/0095843 A1 May 5, 2005

(51) Int. Cl.
*H01L 21/44* (2006.01)

(52) U.S. Cl. .................... 438/687; 438/658

(58) Field of Classification Search ........... 438/687, 438/694, 692, 669, 658, 659, 645, 707, 710, 438/720
See application file for complete search history.

(56) References Cited

U.S. PATENT DOCUMENTS

| | | | | |
|---|---|---|---|---|
| 5,447,887 A | * | 9/1995 | Filipiak et al. | 438/644 |
| 5,821,168 A | * | 10/1998 | Jain | 438/692 |
| 6,046,108 A | * | 4/2000 | Liu et al. | 438/687 |
| 6,146,988 A | * | 11/2000 | Ngo et al. | 438/618 |
| 6,153,523 A | * | 11/2000 | Van Ngo et al. | 438/687 |
| 6,211,084 B1 | * | 4/2001 | Ngo et al. | 438/687 |
| 6,251,775 B1 | * | 6/2001 | Armbrust et al. | 438/644 |
| 6,274,499 B1 | * | 8/2001 | Gupta et al. | 438/692 |
| 6,281,127 B1 | * | 8/2001 | Shue | 438/691 |
| 6,297,154 B1 | * | 10/2001 | Gross et al. | 438/663 |
| 6,355,571 B1 | * | 3/2002 | Huang et al. | 438/706 |
| 6,358,849 B1 | * | 3/2002 | Havemann et al. | 438/689 |
| 6,432,822 B1 | * | 8/2002 | Ngo et al. | 438/687 |
| 6,518,184 B1 | * | 2/2003 | Chambers et al. | 438/687 |
| 6,569,768 B2 | * | 5/2003 | Ruelke et al. | 438/687 |
| 6,764,952 B1 | * | 7/2004 | Yu et al. | 438/687 |
| 6,787,480 B2 | * | 9/2004 | Aoki et al. | 438/775 |
| 6,806,191 B2 | * | 10/2004 | Zistl et al. | 438/687 |

OTHER PUBLICATIONS

T. Takewaki et al., "Excellent Electro/Stress-Migration-Resistance Giant-Grain Copper Interconnect Technology for High-Performance Power Devices," Proceedings of 1995 International Symposium on Power Semiconductor Devices & ICs, Yokohama, pp. 438-442.

S. Hymes et al., "Passivation of copper by silicide formation in dilute silane," *J. Appl. Phys. 71* (9), May 1, 1992, pp. 4623-4625.

* cited by examiner

*Primary Examiner*—M. Wilczewski
(74) *Attorney, Agent, or Firm*—Jacqueline J. Garner; W. James Brady, III; Frederick J. Telecky, Jr.

(57) ABSTRACT

Doping copper interconnects (100) with silicon (115) has been shown to improve Electromigration and Via Stress Migration reliability. After copper (118) is deposited by electrochemical deposition and chemically-mechanically polished back, doping is achieved by flowing $SiH_4$ over the copper interconnect (100) for 0.5 to 5 seconds at a temperature of 325-425° C.

9 Claims, 3 Drawing Sheets

METHOD FOR IMPROVING RELIABILITY OF COPPER INTERCONNECTS

FIELD OF THE INVENTION

The invention is generally related to the field of forming damascene copper interconnects in semiconductor devices and more specifically to improving the reliability of damascene copper interconnects.

BACKGROUND OF THE INVENTION

As the density of semiconductor devices increases, the demands on interconnect layers for connecting the semiconductor devices to each other also increases. Therefore, device fabrication technology is migrating from aluminum metal interconnects to copper interconnects and from traditional silicon-dioxide-based dielectrics to low-k dielectrics, such as organo-silicate glass (OSG). Semiconductor fabrication processes that work with copper interconnects and newer low-k dielectrics are still being developed and optimized. As compared to the traditional subtractive plasma dry etching of aluminum, suitable copper etches for a semiconductor fabrication environment are not readily available. To overcome the copper etch problem, damascene processes have been developed.

In a damascene process, the IMD (intrametal dielectric) is formed first. The IMD is then patterned and etched to form a trench for the interconnect line. If connection vias have not already been formed, a dual damascene process may be used. In a dual damascene process, vias are etched into the ILD (interlevel dielectric) 12 for connection to lower interconnect levels and trenches are etched into the IMD 14. The barrier layer 16 and a copper seed layer are then deposited over open via/trench structures. The barrier layer 16 is typically tantalum nitride or some other binary transition metal nitride and the thin Cu seed layer is deposited using physical vapor deposition. A copper layer is then electro-chemically deposited onto the seed layer that covers the entire structure. The copper is then chemically-mechanically polished (CMP'd) to remove the copper over the IMD 14, leaving copper interconnect lines 18 and vias 20 as shown in FIG. 1. A metal etch is thereby avoided.

Typically, several copper interconnect layers are successively formed. After one metal interconnect layer is formed, an etchstop layer is deposited thereover and the next levels' ILD and IMD are formed. The etchstop layer prevents Cu diffusion from the metal lines into the overlying oxide-based dielectric and protects the Cu from subsequent via/trench etches used to form the next level of interconnect.

SUMMARY OF THE INVENTION

The invention is a method for forming a copper interconnect having improved reliability. After the copper is plated by electrochemical deposition (ECD) and chemically-mechanically polished back, the exposed copper surface is lightly doped with silicon by flowing a silicon containing gas such as $SiH_4$ over the wafer surface immediately prior to depositing the overlying dielectric layer. Silicon doping improves electromigration (EM) and via stress migration (VSM) lifetimes by slowing the Cu diffusion rate at the interface between the Cu leads and the overlying dielectric barrier.

An advantage of the invention is providing a copper interconnect having improved reliability using a method that requires no additional equipment beyond what is normally required to create such interconnects.

This and other advantages will be apparent to those of ordinary skill in the art having reference to the specification in conjunction with the drawings.

DETAILED DESCRIPTION OF THE EMBODIMENTS

The invention will now be described in conjunction with a specific via first copper dual damascene process. It will be apparent to those of ordinary skill in the art that the benefits of the invention may be applied to other copper interconnect processes such as single damascene processes, trench first dual damascene processes and other via first dual damascene processes.

Figure 4:
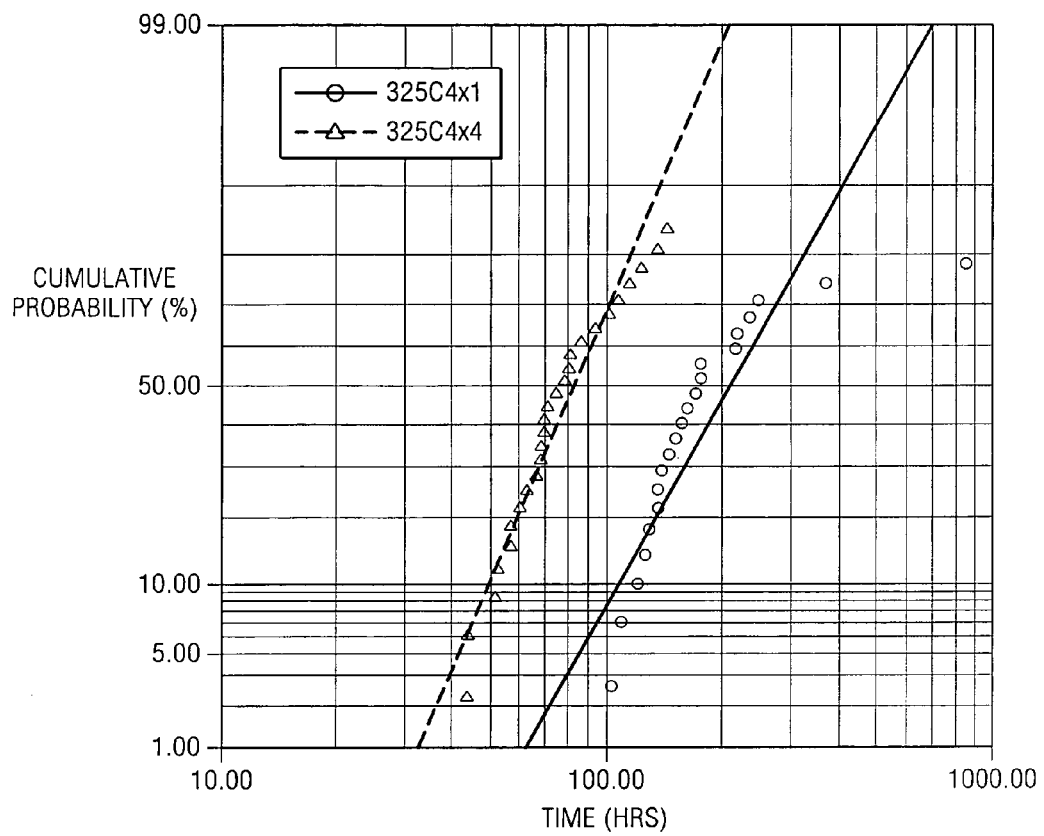
FIG. 4 shows EM lifetime improvement under stress conditions of 325° C. and 1.5 $MA/cm^2$ current density for cases of 1) no silane over wafer prior to SiN deposition and 2) 3 seconds silane over wafer prior to SiN deposition.
Figure 5:
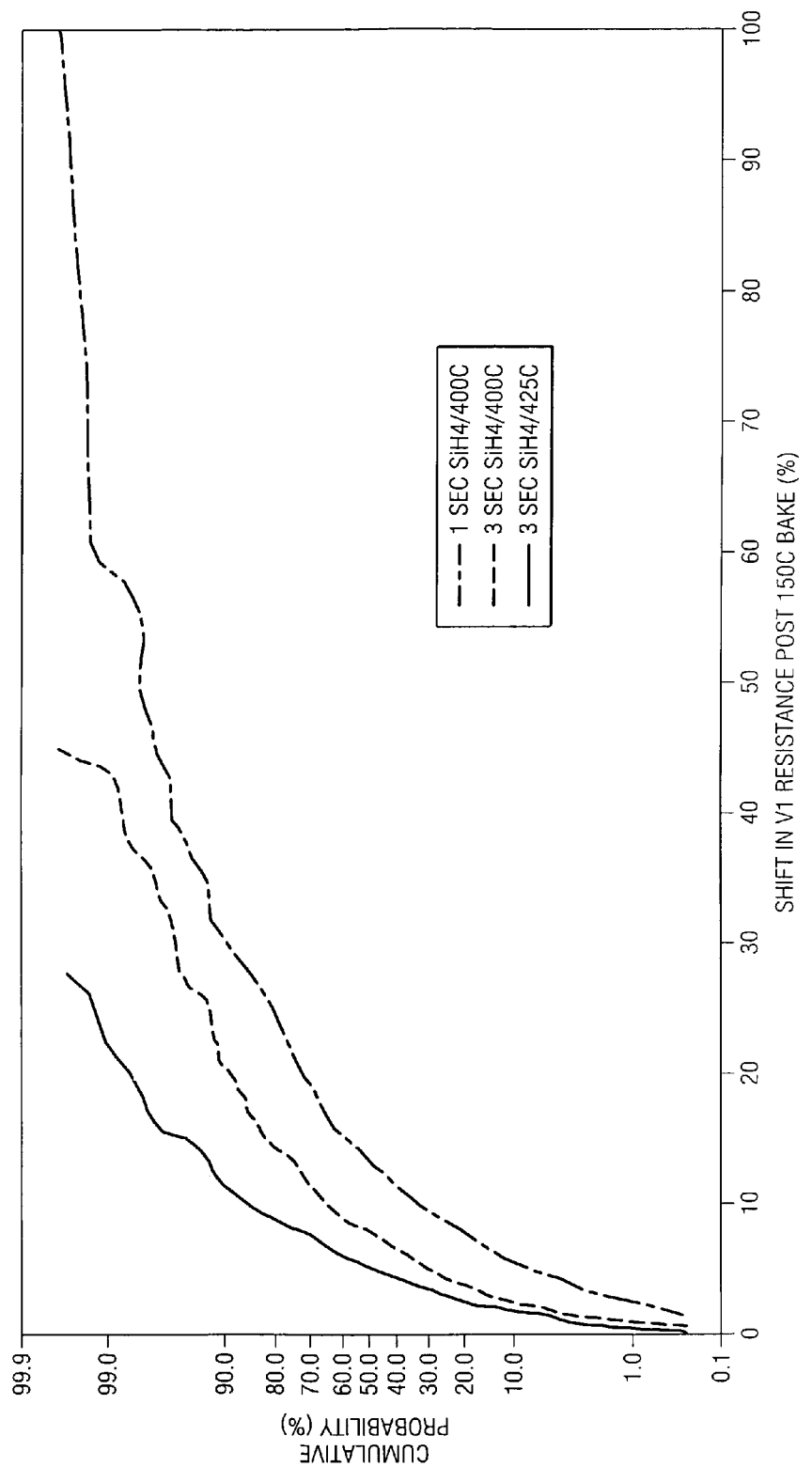
FIG. 5 is a graph of Via Stress Migration improvement with SiH4 exposure and temperature. Increased SiH4 flow or increased temperature result in increased Si doping level of the Cu surface.

As the technology scales to below the 130 nm node, the VSM and EM requirements become more and more difficult to meet. The inventors have discovered that by doping the copper interconnect with a small amount of Si after CMP improves the VSM and EM lifetimes. FIG. 4 shows the EM lifetime improvement for a Si-doped vs. undoped interconnect line of ~0.18 μm width and ~0.35 μm depth under stress conditions of 325° C. and 1.5 $MA/cm^2$. FIG. 5 shows the improvement in Via Stress Migration 48 hr/150 C shift for the case of 0 seconds or 3 seconds $SiH_4$ flow at 400 C and 3 seconds $SiH_4$ flow at 425 C. The EM and VSM improvements are attributed to the improvement in adhesion interface energy between the SiN and the Si-doped Cu, shown in FIG. 6.

Figure 1:
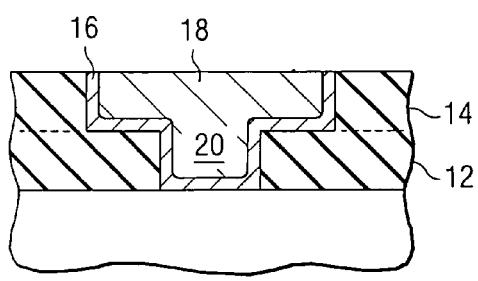
FIG. 1 is a cross-sectional diagram of a conventional (prior art) dual damascene copper interconnect.
Figure 2:
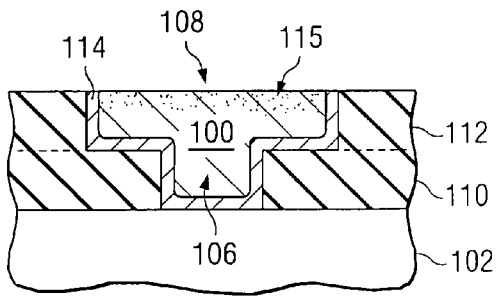
FIG. 2 is a cross-sectional diagram of a copper interconnect formed according to an embodiment of the invention.

A dual damascene copper interconnect 100 formed according to the invention is shown in FIG. 2. Copper interconnect 100 is formed over semiconductor body 102. Semiconductor body 102 typically has transistors and other devices (not shown) formed therein. Semiconductor body 102 may also include one or more additional metal interconnect layers (not shown). Copper interconnect 100 comprises a lead portion formed within trenches 108. A via portion is formed in vias 106 below trenches 108. Vias 106 extend from the bottom of trenches 108 through interlevel dielectric (ILD) 110 to a lower metal interconnect layer. Trenches 108 are formed within intrametal dielectric (IMD) 112. Various materials are known to be suitable for forming ILD 110 and IMD 112. For example, fluorine-doped silicate glass (FSG), organo-silicate glass (OSG), or other low-k or ultra low-k dielectrics may be used.

A metallic barrier layer 114 is located between the copper interconnect 100 and the trench 108 and via 106 sidewalls. Barrier layer 114 prevents copper from diffusing into the ILD 110 and IMD 112. Barrier layer 114 also provides adhesion between the copper and dielectric. Various barrier layers are known in the art. For example, refractory metals, refractory metal-nitrides, refractory metal-silicon-nitrides, or combinations thereof may be used.

Copper interconnect 100 of the preferred embodiment includes Si dopant 115. As discussed further below, doping with Si occurs after copper CMP. Accordingly, Si dopant 115 is gaseously introduced over the surface of copper interconnect 100. The concentration of the as deposited Si dopant is approximately 0.1% Si. As discussed above, doping the copper interconnect 100 with Si improves the EM and VSM lifetimes.

Figure 3A:
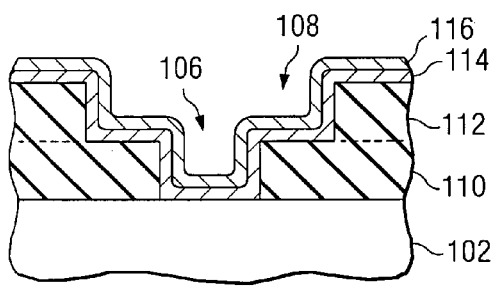
FIGS. 3A-3E are cross-sectional diagrams of the copper interconnect of FIG. 2 at various stages of fabrication.

A method of fabricating copper interconnect 100 according to the invention will now be discussed with reference to FIGS. 3A-3E. Referring to FIG. 3A, semiconductor body 102 is processed through the formation of one or more metal interconnect layers. ILD 110 and IMD 112 are deposited over semiconductor body 102. Suitable materials, such as FSG or OSG, for ILD 110 and IMD 112 are known in the art. Trenches 108 are formed in IMD 112 and vias 106 are formed in ILD 110, using conventional processing.

Barrier layer 114 is formed over IMD 112 including within trenches 108 and vias 106. Barrier layer 114 functions as a diffusion barrier to prevent copper diffusion and as an adhesion layer. Transition metals and their nitrides are typically used for barriers. A transition metal-silicon nitride as well as combinations of transition metals, transition metal-nitrides and transition metal-silicon-nitrides may also be used. As an example, barrier layer 114 may comprise a Ta—N based sputtered film.

Still referring to FIG. 3A, a copper seed layer 116 may be deposited over barrier layer 114. Physical vapor deposition is traditionally used to form copper seed layer 116. Other methods for forming copper seed layer 116, such as CVD are known in the art. Copper seed layer 116 is preferably undoped. The copper seed layer 116 is needed to pass current and to serve as a nucleation layer for the copper ECD process.

Figure 3B:
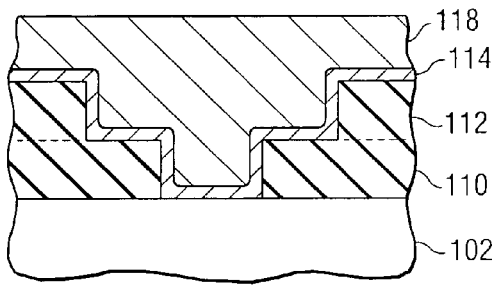

After deposition of the copper seed layer 116, the wafer is transferred to the ECD tool. Copper film 118 is formed by ECD. Various suitable ECD process are known in the art. In a preferred embodiment of the invention, the wafer is transferred to the plating cell of an ECD tool and a plating process is conducted. The plating step may include several plating currents as is well known in the art. The resulting copper film 118 is shown in FIG. 3B. While ECD copper is described herein, the invention is not limited to ECD deposited copper.

Figure 3C:
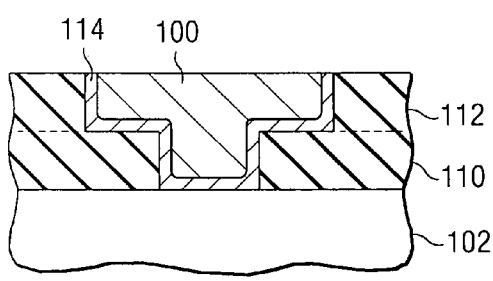

After the final copper thickness is achieved, the copper film 118 may be annealed. After the ECD process and any annealing steps, the copper layer 118 (which incorporates seed layer 116) and barrier layer 114 are chemically-mechanically polished to remove the excess material above a surface level of IMD 112. The remaining copper and barrier 114 in the trench forms copper interconnect 100, as shown in FIG. 3C.

Figure 3D:
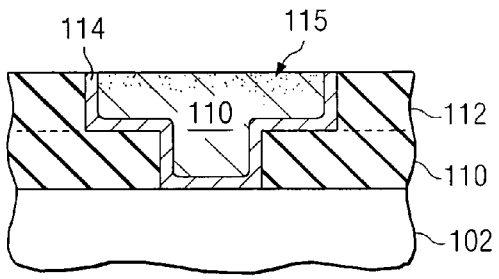

After the copper CMP and prior to depositing any subsequent layers, such as the etchstop layer for the next metal interconnect level, the surface of copper interconnect 100 is doped with silicon, as shown in FIG. 3D. In the preferred embodiment of the invention, silicon doping is achieved in the same chamber used for depositing the subsequent etchstop layer after CMP, any post CMP cleans and pre-etchstop deposition cleans are performed. Prior to striking a plasma in the chamber to begin SiN deposition, the semiconductor body is heated to approximately 425° C. and $SiH_4$ (silane) gas is allowed to flow into the chamber and contact the surface of copper interconnect 100. Allowing the silane gas to flow for a few (0.5 to 5) seconds prior to striking the plasma (i.e., with the RF power still off), dopes the surface of the copper interconnect with silicon. For example, flowing the silane gas at a rate of 670 sccms for approximately three seconds prior to striking the plasma results ultimately in a silicon doping of approximately 0.1% for trench depths of ~0.45 microns. Silicon doping in the range of 0.03 at. % to 0.5 at. % is desired. Various methods for doping the surface of copper interconnect 100 will be apparent to those of ordinary skill in the art having reference to this specification.

It should be noted that the doping levels of the instant invention do not result in silicidation at the copper surface. At ~400° C., the solid solubility limit of Si in pure Cu is ~8 at. %. This is well above the levels of the instant invention. The duration of the exposure to $SiH_4$ is short (on the order of 3 sec.) in the instant invention, whereas normal silicidation exposure times are much longer (e.g., greater than 5 min.).

It should also be noted that Si doping negatively impacts resistivity of the copper interconnect. The resistivity increase depends on the final doping concentration which, in turn, depends on film thickness.

Figure 3E:
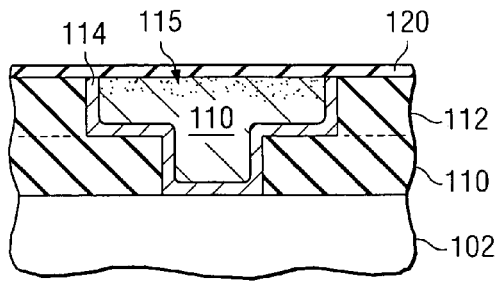
Figure 6:
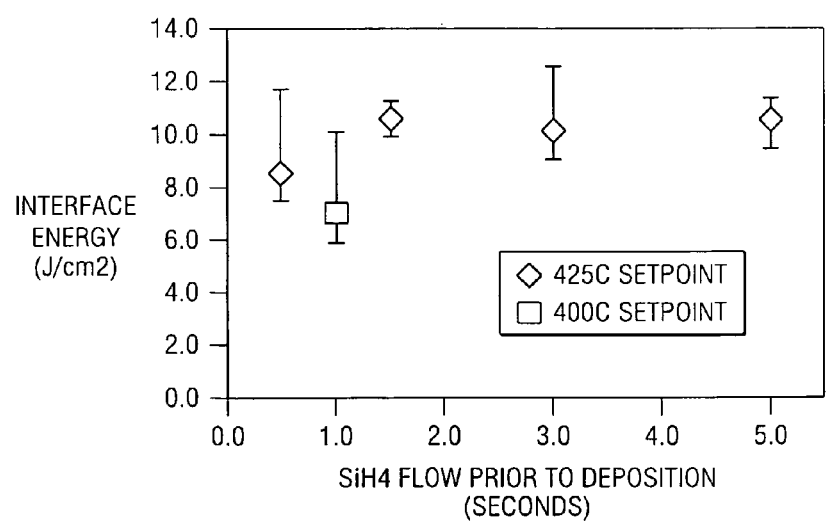
FIG. 6 is a graph depicting the interface adhesion energy (as determined by 4-point bending methodology) for the case of various doping conditions. The interface strength improves with higher doping levels.

After doping the surface of the copper interconnect 100 to the desired level, a plasma is struck in the chamber and a SiN etchstop layer 120 is deposited as shown in FIG. 3E. As illustrated in FIG. 6 and discussed above, silicon doping of the copper interconnect improves SiN adhesion to the copper surface. Processing may then continue to form the next metal interconnect level (i.e., a second ILD, IMD, trench, vias, barrier, and copper), any additional metal interconnect levels and to package the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method for fabricating an integrated circuit, comprising the steps of:
   forming a dielectric layer;
   forming openings in the dielectric layer;
   filling said openings with a barrier, a copper seed, and an electroplated copper film;
   chemically-mechanically polishing said copper film; and
   after chemically-mechanically polishing said copper film, forming a silicon nitride layer by:
   transferring the semiconductor body to a chamber;
   gaseously doping the copper film with silicon without forming a copper silicide by flowing a gas chemistry consisting of silane over the copper film in the chamber with the RF power off prior to striking a plasma;
   striking said plasma in said chamber after flowing said silane for at least 0.5 seconds; and then flowing at least one nitrogen-containing source gas into said chamber to deposit a silicon nitride layer over said copper interconnect.

2. The method of claim 1, wherein said doping step dopes only a top region of the copper film with silicon.

3. The method of claim 1, wherein said doping step dopes a surface of said copper film that leads to a final bulk silicon concentration in the range of 0.03 at. % to 0.5 at. %.

4. The method of claim 1, wherein said dielectric layer comprises an interlevel dielectric and an intrametal dielectric.

5. The method of claim 4, wherein said openings comprise vias in the interlevel dielectric and trenches in the intrametal dielectric.

6. The method of claim 1, wherein said doping step comprises flowing silane over the copper film for a duration in the range of 0.5 to 5 seconds at 325° C.-425° C.

7. A method of fabricating an integrated circuit, comprising the steps of:
   providing a semiconductor body having a trench formed in a dielectric layer at a surface thereof;
   forming a copper film over the semiconductor body including with said trench,
   chemically-mechanically polishing the copper film to form a copper interconnect;
   after said chemical-mechanical polish step, doping said copper interconnect with silicon without forming a silicide by flowing silane over a surface of the copper interconnect with an RF power off prior to striking a plasma;
   wherein said doping step comprises part of a silicon nitride derosition process;
   and wherein said silicon nitride deposition process comprises the steps of:
      transferring the semiconductor body to a chamber;
      performing said doping step by flowing silane in said chamber for a given time prior striking said plasma in said chamber;
      striking said plasma in said chamber after flowing said silane for at least 0.5 seconds; and
      then flowing at least one nitrogen-containing source gas into said chamber to deposit a silicon nitride layer over said copper interconnect.

8. The method of claim 7, wherein said silane is flowed over the surface of the copper interconnect for a duration of approximately 3 seconds.

9. The method of claim 7, wherein said silane is flowed over the surface of the copper interconnect for a duration in the range of 0.05 to 5 seconds at 325° C. to 425° C.

* * * * *